US010199525B2

(12) United States Patent
Nada et al.

(10) Patent No.: US 10,199,525 B2
(45) Date of Patent: Feb. 5, 2019

(54) LIGHT-RECEIVING ELEMENT AND OPTICAL INTEGRATED CIRCUIT (71) Applicant: NIPPON TELEGRAPH AND TELEPHONE CORPORATION, Tokyo (JP)

(72) Inventors: Masahiro Nada, Tokyo (JP); Kenji Kurishima, Tokyo (JP); Shinji Matsuo, Tokyo (JP); Hideaki Matsuzaki, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 15/576,669

(22) PCT Filed: May 25, 2016

(86) PCT No.: PCT/JP2016/065428
§ 371 (c)(1),
(2) Date: Nov. 22, 2017

(87) PCT Pub. No.: WO2016/190346
PCT Pub. Date: Dec. 1, 2016

(65) Prior Publication Data
US 2018/0138350 A1 May 17, 2018

(30) Foreign Application Priority Data
May 28, 2015 (JP) .................................. 2015-108575

(51) Int. Cl.
G02B 6/12 (2006.01)
H01L 31/107 (2006.01)
(Continued)

(52) U.S. Cl.
CPC ............ *H01L 31/1075* (2013.01); *G02B 6/12* (2013.01); *H01L 31/02327* (2013.01);
(Continued)

(58) Field of Classification Search
CPC .......... H01L 31/02327; H01L 31/0304; H01L 31/1075; H01L 31/035272; H01L 31/0336
See application file for complete search history.

(56) References Cited

U.S. PATENT DOCUMENTS 7,397,101 B1   7/2008  Masini et al.
7,521,737 B2   4/2009  Augusto
(Continued)

FOREIGN PATENT DOCUMENTS

JP  S58-080879 A   5/1983
JP  S60-071920 A   4/1985
(Continued)

OTHER PUBLICATIONS

T. Ishibashi et al., "Uni-Traveling-Carrier Photodiodes", in proceedings of Ultrafast Electronics and Optoelectronics, vol. 13, Optical Society of America, 1997.
(Continued)

Primary Examiner — Thomas A Hollweg
Assistant Examiner — Mary A El-Shammaa
(74) Attorney, Agent, or Firm — Womble Bond Dickinson (US) LLP (57) ABSTRACT A light-receiving element (10) according to the present invention includes a semiconductor layer (100) including a p-type semiconductor region (101), an n-type semiconductor region (102), and a multiplication region (103), and a p-type light absorption layer (104) formed on the multiplication region. The p-type semiconductor region and the n-type semiconductor region are formed to sandwich the multiplication region in a planar direction of the semiconductor
(Continued)

layer. This allows an easy implementation of a light-receiving element that serves as an avalanche photodiode by a monolithic manufacturing process.

8 Claims, 6 Drawing Sheets

(51) Int. Cl.
 *H01L 31/0232* (2014.01)
 *H01L 31/0352* (2006.01)
 *H01L 31/0304* (2006.01)
 *H01L 31/0336* (2006.01)

(52) U.S. Cl.
 CPC .... *H01L 31/035272* (2013.01); *H01L 31/107* (2013.01); *H01L 31/0304* (2013.01); *H01L 31/0336* (2013.01)

(56) References Cited

U.S. PATENT DOCUMENTS

| | | | |
|---|---|---|---|
| 2005/0051861 A1* | 3/2005 | Shi | B82Y 10/00 257/438 |
| 2007/0053643 A1* | 3/2007 | West | G02B 6/12004 385/131 |
| 2010/0133637 A1* | 6/2010 | Yagyu | H01L 31/1075 257/438 |
| 2010/0243030 A1* | 9/2010 | Yago | H01L 23/544 136/244 |
| 2012/0126286 A1 | 5/2012 | Na et al. | |
| 2012/0248413 A1* | 10/2012 | Dimmock | B82Y 20/00 257/25 |
| 2013/0009265 A1* | 1/2013 | Dautet | H01L 31/107 257/438 |
| 2013/0168793 A1* | 7/2013 | Ishibashi | H01L 31/1075 257/438 |
| 2013/0299936 A1* | 11/2013 | Takemura | H01L 31/107 257/458 |
| 2013/0313579 A1* | 11/2013 | Kouvetakis | H01L 31/028 257/80 |
| 2014/0131827 A1* | 5/2014 | Yamaguchi | H01L 31/1075 257/438 |
| 2014/0291682 A1 | 10/2014 | Huang et al. | |
| 2018/0254373 A1* | 9/2018 | Domoto | H01L 31/1844 |

FOREIGN PATENT DOCUMENTS

| | | |
|---|---|---|
| JP | S64-090570 A | 4/1989 |
| JP | H03-244164 A | 10/1991 |
| JP | 2001-168372 A | 6/2001 |
| WO | 2013/180690 A1 | 12/2013 |

OTHER PUBLICATIONS

J.C. Campbell, "Recent Advances in Telecommunications Avalanche Photodiodes", IEEE Journal of Lightwave Technology, vol. 25, No. 1, Jan. 2007.
B. Jalali et al., "Silicon Photonics", IEEE Journal of Lightwave Technology, vol. 24, No. 12, Dec. 2006.
J.J. Ackert et al., "10 Gbps silicon waveguide—integrated infrared avalanche photodiode", Optics Express, vol. 21, 19530, Aug. 2013.
N. Duan et al., "High Speed Waveguide-Integrated Ge/Si Avalanche Photodetector", in proceedings of OFC/NFOEC Technical Digest, OSA, 2013.
Supplementary European Search Report and Written Opinion received for EP Patent Application No. 16800050.3, dated Nov. 20, 2018, 5 pages.

* cited by examiner

LIGHT-RECEIVING ELEMENT AND OPTICAL INTEGRATED CIRCUIT

TECHNICAL FIELD

The present invention relates to a light-receiving element that converts an optical signal to an electrical signal, and an optical integrated circuit including the light-receiving element, and relates to, for example, a light-receiving element that makes full use of a function as an avalanche photodiode.

BACKGROUND ART

A general optical receiver in optical communication is generally formed by a light-receiving element and a transimpedance amplifier (to be also referred to as a "TIA" hereinafter) that amplifies a photocurrent generated by the light-receiving element.

Examples of the light-receiving element used in the optical receiver are a photodiode (to be also referred to as a "PD" hereinafter) and an avalanche photodiode (to be also referred to as an "APD" hereinafter).

The PD has a function of converting incident light to a current. The upper limit of the photoelectric conversion efficiency of the PD is 100% as quantum efficiency. As the PD, a uni-traveling carrier photodiode (UTC-PD) and the like are known in addition to a general element made of a III-V compound semiconductor such as InGaAs (see, for example, non-patent literature 1).

On the other hand, the APD is a light-receiving element having a function of making photoelectrons generated in the element hit a lattice by accelerating them under a high electric field and thus ionizing the photoelectrons, thereby amplifying the carriers. The APD can output a plurality of carriers in correspondence with one photon, and thus obtain a sensitivity higher than 100% as the quantum conversion efficiency. For this reason, the APD is widely used for a high-sensitivity optical receiver (see, for example, non-patent literature 2).

In recent years, for the purpose of downsizing an optical receiver and reducing the cost of the optical receiver, research and development of monolithic integration of integrating an optical waveguide including an optical multiplexer and an optical demultiplexer, a light-receiving element, a TIA, and the like into a single IC chip are attracting attention. Particularly, "silicon photonics" of sharing a silicon (Si)-based IC and a manufacturing process and manufacturing an optical active element such as a light-receiving element has been extensively researched and developed (see, for example, non-patent literature 3).

By applying a silicon photonics technique to an optical receiver, the integration and formation of a light-receiving element and a CMOS (Complementary Metal Oxide Semiconductor) circuit on silicon (Si) or SOI (Silicon On Insulator) together become possible. Thus, it is possible to reduce the cost in terms of the mass productivity of the optical receiver, the stability of the manufacturing process, packaging, and inspection.

In recent research and development of the optical receiver by silicon photonics, a method of performing, on a silicon substrate, crystal growth of germanium (Ge) having sensitivity in a 1.3-μm band and having a relatively small difference in lattice constant with respect to silicon, a method of growing, on an InP substrate, InGaAs functioning as a light absorption layer and then transferring InGaAs onto an Si substrate by, for example, bonding, or the like is used. For the purpose of improving the sensitivity of the light-receiving element, an APD including a multiplication layer made of silicon (Si) has also been researched and developed.

As an APD by silicon photonics, a "vertical incident type" APD having a structure for stacking a light absorption layer on an Si or SOI substrate and performing voltage application and light injection in a direction parallel to the stacking direction, or a "normal incident type" APD is known.

In addition to the above APDs, a waveguide type APD by silicon photonics is known. The waveguide type APD has the feature that an optical waveguide and a light-receiving unit can be integrated and it is unnecessary to use a spatial optical system at the time of implementation. As a waveguide type APD, for example, non-patent literature 4 discloses an APD whose degree of integration of devices is improved by accelerating light absorption by forming a waveguide in an Si substrate and injecting a fault into the waveguide, and composing, by only Si, a material for applying an electric field in the waveguide and multiplying it.

Non-patent literature 5 discloses a waveguide type APD in which a contact layer is provided in each waveguide having functions as a Ge light absorption layer and an Si multiplication layer and evanescent coupling is used for optical coupling between the Ge light absorption layer and the waveguide.

RELATED ART LITERATURE

Non-Patent Literature

Non-Patent Literature 1: T. Ishibashi et al., "Uni-Traveling-Carrier Photodiodes", in proceedings of Ultrafast Electronics and Optoelectronics, Vol. 13, Optical Society of America, 1997.

Non-Patent Literature 2: J. C. Campbell, "Recent Advances in Telecommunications Avalanche Photodiodes", IEEE JOURNAL OF LIGHTWAVE TECHNOLOGY, Vol. 25, No. 1, January 2007.

Non-Patent Literature 3: B. Jalali et al., "Silicon Photonics", IEEE JOURNAL OF LIGHTWAVE TECHNOLOGY, Vol. 24, No. 12, December 2006.

Non-Patent Literature 4: J. J. Ackert et al., "10 Gbps silicon waveguide-integrated infrared avalanche photodiode", OPTICS EXPRESS, Vol. 21, 19530, August, 2013.

Non-Patent Literature 5: N. Duan et al., "High Speed Waveguide-Integrated Ge/Si Avalanche Photodetector", in proceedings of OFC/NFOEC Technical Digest, OSA, 2013.

DISCLOSURE OF INVENTION

Problem to be Solved by the Invention

However, the above-described conventional APDs have the following problems.

For example, the vertical incident type APD matches a CMOS process but the layer arrangement is complicated. It is thus necessary to add an enormous number of man-hours, thereby complicating the manufacturing process. The waveguide type APD has lower sensitivity due to the problem of optical coupling efficiency or the optical absorption coefficient of the light absorption layer, and the high gain performance and band performance cannot be simultaneously implemented because of the nonuniformity of the electric field being applied to the Si multiplication layer, thereby limiting the increase in operating speed.

That is, when a vertical incident structure is applied to as an APD, it is possible to improve the sensitivity and to increase the speed, but a problem of the more complicated manufacturing process of the APD becomes evident. When a waveguide structure is applied to as an APD, it is possible to relatively easily implement high-density integration with a CMOS IC by manufacturing the APD in accordance with the manufacturing process of the CMOS IC, but a problem of a functionality as an APD, that is, insufficiencies in the high sensitivity performance and high speed performance becomes evident.

The present invention has been made in consideration of the above problems, and an object of the present invention is to easily implement a light-receiving element that serves as an APD by a monolithic manufacturing process.

Means of Solution to the Problem

According to the present invention, there is provided a light-receiving element that comprises a semiconductor layer including a p-type semiconductor region, an n-type semiconductor region, and a multiplication region, and a p-type light absorption layer formed on the multiplication region, wherein the p-type semiconductor region and the n-type semiconductor region are formed to sandwich the multiplication region in a planar direction of the semiconductor layer.

Effect of the Invention

According to the present invention, it is possible to easily implement a light-receiving element that serves as an APD by a monolithic manufacturing process.

BEST MODE FOR CARRYING OUT THE INVENTION

1. Outline of Light-Receiving Element and Optical Integrated Circuit of Present Invention (1) According to the present invention, there is provided a light-receiving element (10-14) that comprises a semiconductor layer (100) including a p-type semiconductor region (101), an n-type semiconductor region (102), and a multiplication region (103), and a p-type light absorption layer (104; 114; 124; 134) formed on the multiplication region, wherein the p-type semiconductor region and the n-type semiconductor region are formed to sandwich the multiplication region in a planar direction of the semiconductor layer.

(2) In the light-receiving element (11), the light absorption layer (114) may have a band gap that decreases toward the multiplication region.

(3) The light-receiving element (12) may further comprise a barrier layer (107) that is formed on the light absorption layer, and has a conduction band edge energy higher than that of the light absorption layer.

(4) In the light-receiving element (13), the light absorption layer (124) may have a p-type impurity concentration that decreases toward the multiplication region.

(5) In the light-receiving element, the multiplication region may include Si, the light absorption layer may include $Ge_xSi_{1-x}$, and the light absorption layer may have a composition ratio x of $Ge_xSi_{1-x}$ that increases toward the multiplication region.

(6) In the light-receiving element (11), the multiplication region may include Si, the light absorption layer (114) may include $Ge_xSi_{1-x}$, and the light absorption layer may have a composition ratio x of $Ge_xSi_{1-x}$ that decreases toward the multiplication region.

(7) In the light-receiving element (13), the multiplication region may include a III-V compound semiconductor, the light absorption layer (124) may include a III-V compound semiconductor, and a composition ratio of the III-V compound semiconductor forming the light absorption layer may decrease toward the multiplication region.

(8) In the light-receiving element (14), the multiplication region may include Si, and the light absorption layer (134) may include a III-V compound semiconductor (InGaAs).

(9) According to the present invention, there is provided an optical integrated circuit (20) that comprises a light-receiving element (10-14), a core (140) that is formed on a semiconductor layer and optically coupled to a light absorption layer, and a clad layer (141) formed on the core.

Note that in the above description, constituent elements in drawings corresponding to those of the present invention are denoted by reference numerals in parentheses, as an example.

2. Embodiments

Embodiments of a light-receiving element and an optical integrated circuit according to the present invention will be described below with reference to the accompanying drawings.

First Embodiment

Figure 1:
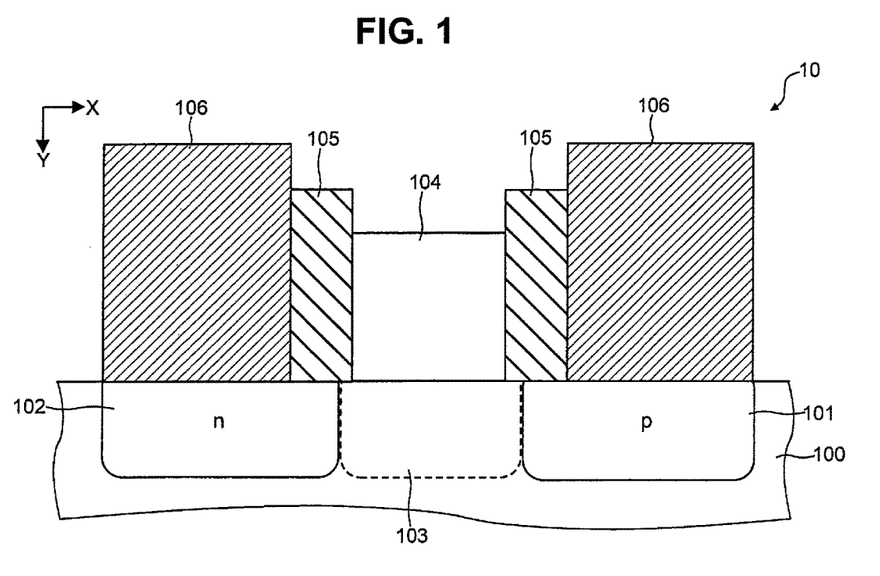
FIG. 1 is a sectional view schematically showing a light-receiving element according to the first embodiment.

FIG. 1 is a sectional view schematically showing a light-receiving element according to the first embodiment.

A light-receiving element 10 shown in FIG. 1 has a structure in which a light absorption layer 104 is stacked on a multiplication region 103 formed between a p-type semiconductor region 101 and an n-type semiconductor region 102 in a semiconductor layer 100.

The light-receiving element 10 functions as an APD of making photoelectrons generated in the light absorption layer 104 by light irradiation and diffused to the multiplication region 103 hit a lattice in the multiplication region 103 by accelerating them by a high electric field based on a reverse bias applied between the p-type semiconductor region 101 and the n-type semiconductor region 102, and thus ionizing the photoelectrons, thereby amplifying the carriers. The light-receiving element 10 will be described in detail below.

As shown in FIG. 1, the light-receiving element 10 includes the semiconductor layer 100, the light absorption layer 104, electrode layers 106, and insulating layers 105.

The semiconductor layer 100 includes the p-type semiconductor region 101, the n-type semiconductor region 102, and the multiplication region 103. For example, a silicon (Si) substrate or an SOI (Silicon On Insulator) substrate can be exemplified as the semiconductor layer 100.

The p-type semiconductor region 101 and the n-type semiconductor region 102 are formed in the semiconductor layer 100. The p-type semiconductor region 101 is formed by, for example, ion implantation of boron (B) into the surface Si layer of the Si or SOI substrate serving as the semiconductor layer 100. The n-type semiconductor region 102 is formed by, for example, ion implantation of arsenic (As) into the surface Si layer of the Si or SOI substrate serving as the semiconductor layer 100.

As shown in FIG. 1, the p-type semiconductor region 101 and the n-type semiconductor region 102 are formed to sandwich the multiplication region 103 in the planar direction (for example, an X direction in FIG. 1) of the semiconductor layer 100.

The multiplication region 103 is a region for amplifying carriers by accelerating, by the high electric field, photoelectrons moving from the light absorption layer 104. More specifically, the multiplication region 103 is a region of the semiconductor layer 100, where no impurity for forming the p-type semiconductor region 101 or the n-type semiconductor region 102 is injected. For example, when the semiconductor layer 100 is formed from the Si or SOI substrate, the multiplication region 103 is a region made of Si.

In a CMOS process, the length in the X direction of the multiplication region 103 (the distance in the X direction between the p-type semiconductor region 101 and the n-type semiconductor region 102) is appropriately settable within a range of, for example, 20 nm to 200 nm.

The light absorption layer 104 is a layer for generating electron-hole pairs by light irradiation, and is formed in contact with the multiplication region 103 of the semiconductor layer 100. The light absorption layer 104 is made of a p-type semiconductor material. As the p-type semiconductor material, Ge can be exemplified. As an impurity to be injected into the light absorption layer 104, B can be exemplified.

The electrode layers 106 constitute electrodes for applying voltages to the p-type semiconductor region 101 and the n-type semiconductor region 102, respectively, and are formed on the p-type semiconductor region 101 and the n-type semiconductor region 102 in the semiconductor layer 100, respectively. The electrode layers 106 are made of a metal material containing, for example, tungsten (W) or copper (Cu) as a main component.

The insulating layers 105 are used to insulate the light absorption layer 104 and the electrode layers 106. The insulating layers 105 are made of, for example, silicon oxide (for example, $SiO_2$).

A method of manufacturing the light-receiving element 10 according to this embodiment will be briefly explained.

First, the p-type semiconductor region 101 and the n-type semiconductor region 102 are formed in the surface Si layer of the Si or SOI substrate serving as the semiconductor layer 100. More specifically, the p-type semiconductor region 101 is formed by injecting B into the surface Si layer of the Si or SOI substrate while forming the n-type semiconductor region 102 by injecting As at a predetermined interval with respect to the p-type semiconductor region 101 in the planar direction of the semiconductor layer 100. The impurities are injected by, for example, a well-known ion implantation method or the like.

This forms the p-type semiconductor region 101 and the n-type semiconductor region 102, and a region where no impurity is doped between the p-type semiconductor region 101 and the n-type semiconductor region 102 is formed as the multiplication region 103.

Note that as the interval between the p-type semiconductor region 101 and the n-type semiconductor region 102 in the planar view, a distance enough for the region between the p-type semiconductor region 101 and the n-type semiconductor region 102 to function as the multiplication region 103 is ensured.

Next, an insulating film is formed on the semiconductor layer 100. For example, a silicon oxide layer ($SiO_2$) is formed on the semiconductor layer 100 by a plasma CVD method. An opening is formed in a region of an upper portion of the multiplication region 103 in the silicon oxide layer. For example, the region of the upper portion of the multiplication region 103 in the silicon oxide layer is selectively removed by a well-known photolithography technique and dry etching technique.

Next, the light absorption layer 104 is formed by selectively growing Ge on the multiplication region 103 in the semiconductor layer 100 using, as a selective growth mask, the silicon oxide layer in which the opening has been formed. For example, it is possible to selectively grow Ge on the multiplication region 103 in the semiconductor layer 100 by depositing Ge under a substrate temperature condition of 600° C. by a CVD (Chemical Vapor Deposition) method using $GeH_4$ as a source gas. To relax large lattice mismatching between the Si layer and the Ge light absorption layer, $Ge_xSi_{1-x}$ may be grown between the Si layer and the Ge light absorption layer. In this selective growth, no Ge is deposited on the selective growth mask.

Note that the light absorption layer 104 may exhibit p-type conductivity by adding a boron compound (for example, $B_2H_6$) together with the source gas or by injecting B as an impurity by, for example, ion implantation after selectively growing Ge.

Next, the electrode layers 106 are formed. The silicon oxide layer (insulating film) deposited on the p-type semiconductor region 101 and the n-type semiconductor region 102 in the semiconductor layer 100 is selectively removed by, for example, a well-known photolithography technique and dry etching technique. Then, the electrode layers 106 made of a metal material containing, for example, tungsten (W) or copper (Cu) are formed on the p-type semiconductor region 101 and the n-type semiconductor region 102 by, for example, a well-known lift-off method. More specifically, after a resist pattern used to selectively remove the silicon oxide layer is left and the metal material containing W or Cu is deposited on the semiconductor layer 100 and resist pattern, the resist pattern is removed. This forms the electrode layers 106 on the p-type semiconductor region 101 and the n-type semiconductor region 102. To deposit W, for example, a well-known evaporation method is used. To deposit Cu, for example, a well-known plating method is used.

The silicon oxide layer (insulating film) between each electrode layer 106 and the light absorption layer 104 serves as the insulating layer 105.

By executing the above steps, the light-receiving element 10 according to the first embodiment can be manufactured.

The principle of the operation of the light-receiving element 10 as an APD according to the first embodiment will be described next.

Figure 2:
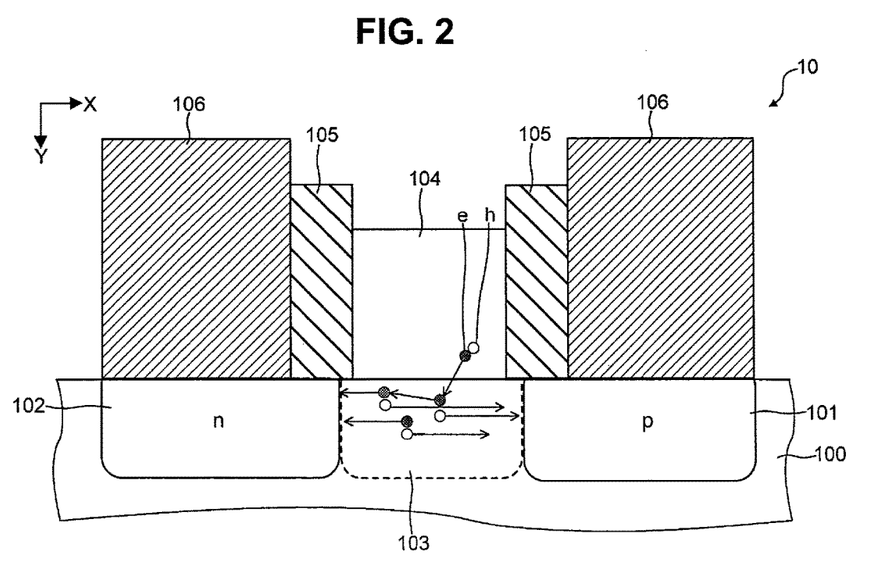
FIG. 2 is a view for explaining the operation principle of the light-receiving element according to the first embodiment.

FIG. 2 is a view for explaining the operation principle of the light-receiving element according to the first embodiment.

When a reverse bias voltage is applied between the p-type semiconductor region 101 and the n-type semiconductor region 102 and the electric field strength of the multiplication region 103 between the p-type semiconductor region 101 and the n-type semiconductor region 102 reaches a strength enough for avalanche multiplication, the multiplication region 103 exhibits a multiplication function.

On the other hand, when light is injected into the light absorption layer 104, electron-hole pairs are generated in the light absorption layer 104, as shown in FIG. 2. Since the light absorption layer 104 is doped into p-type conductivity, it is electrically neutral and no electric field is generated. The generated electron-hole pairs move in the light absorption layer 104 by diffusion. That is, electrons in the light absorption layer 104 move to the multiplication region 103 after a diffusion process, and holes in the light absorption layer 104 move to the multiplication region 103 after a lapse of a dielectric relaxation time.

When the film thickness of the light absorption layer 104 (the length of the light absorption layer 104 in a direction perpendicular to the plane of the semiconductor layer 100) is large, the electrons and holes generated in the light absorption layer 104 are coupled again after a lapse of a given carrier life time, and cannot reach the multiplication region 103. On the other hand, when the film thickness of the light absorption layer 104 is made small to be used for the waveguide type light-receiving element, it is possible to diffuse and move the electrons generated in the light absorption layer 104 to the multiplication region 103, and move the holes to the multiplication region 103 after a lapse of a dielectric relaxation time. Thus, in the semiconductor layer 100 according to this embodiment, the film thickness of the light absorption layer 104 is set to a size that allows the electrons and holes generated in the light absorption layer 104 to be diffused and moved to the multiplication region 103. More specifically, the film thickness of the light absorption layer 104 is set to about several hundred nm. This can move the electrons and holes generated in the light absorption layer 104 to the multiplication region 103. That is, in the light-receiving element 10 according to this embodiment, the electron-hole pairs in the light absorption layer 104 exhibit the same behavior as that of the uni-traveling carrier photodiode (UTC-PD), and the carrier transport time of the light absorption layer 104 is dominated by the electrons.

The electrons and holes injected into the multiplication region 103 repeat avalanche multiplication by the high electric field in the multiplication region 103. This moves the holes to the p-type semiconductor region 101 and moves the electrons to the n-type semiconductor region 102, and thus the light-receiving element 10 functions as an APD.

As described above, the light-receiving element 10 according to the first embodiment has a structure in which the light absorption layer 104 is stacked on the multiplication region 103 formed between the p-type semiconductor region 101 and the n-type semiconductor region 102 in the semiconductor layer 100. Therefore, no electric field control layer is required, and the layer arrangement is simpler than that of the conventional vertical incident type APD or the like.

For example, the conventional vertical incident type APD having the structure in which a light absorption layer and a multiplication layer are sandwiched between electrodes requires an electric field control layer to selectively provide a high electric field strength to only the multiplication layer. The electric field provided to the light absorption layer needs to be suppressed to the extent that neither avalanche breakdown nor Zener breakdown occurs in the light absorption layer itself while the carriers reach the saturation velocity. Thus, fine doping control corresponding to the materials and film thicknesses of the light absorption layer and the multiplication layer is required for the electric field control layer. To the contrary, the light-receiving element 10 according to the first embodiment has no structure in which the light absorption layer 104 is sandwiched between electrodes (the p-type semiconductor region 101 and the n-type semiconductor region 102), unlike the conventional APD. Therefore, no electric field control layer is required, and the manufacturing process is simpler than that for the conventional vertical incident type APD or the like.

As described above, as the manufacturing process of the light-receiving element 10 according to the first embodiment, a well-known Si/Ge CMOS process can be applied.

Therefore, the light-receiving element 10 according to the first embodiment can be manufactured by a process simpler than that for the conventional vertical incident type APD and integrated with a CMOS IC at a high density.

Furthermore, the light-receiving element 10 according to the first embodiment has a structure in which a direction (X direction in FIG. 1) in which a pin junction is formed from the p-type semiconductor region 101, the multiplication region 103, and the n-type semiconductor region 102 in the semiconductor layer 100 is different from the stacking direction (Y direction in FIG. 1) of the light absorption layer 104 on the multiplication region 103. Therefore, an electric field when a voltage is applied between the p-type semiconductor region 101 and the n-type semiconductor region 102 almost acts on only the multiplication region 103. This can uniformly apply the electric field to the multiplication region 103.

Since part of the electric field also acts on the light absorption layer 104 depending on the dielectric constant of the material on the semiconductor layer 100 but the light absorption layer 104 is doped into p-type conductivity, the light absorption layer 104 is maintained to be electrically neutral for some electric field. Therefore, in the light-receiving element 10 according to the first embodiment, an electric field is hardly generated to the light absorption layer 104 in principle. It is thus possible to suppress depletion of the light absorption layer 104 and a decrease in operating speed of the APD.

Therefore, unlike the conventional waveguide type APD, in the light-receiving element 10 according to the first embodiment, the electric filed is uniformly applied to the multiplication region 103 and it is possible to suppress depletion of the light absorption layer 104. It is thus possible to ensure high sensitivity performance and high speed performance as an APD. For example, it is possible to implement a high gain bandwidth product (GBP) of 300 GHz or more by forming the p-type semiconductor region 101 and the n-type semiconductor region 102 so that the distance (the width of the multiplication region 103) in the planar direction between the p-type semiconductor region 101 and the n-type semiconductor region 102 falls within a range of about 100 to 500 nm.

As described above, according to the light-receiving element 10 of the first embodiment, it is possible to easily implement a light-receiving element that serves as an APD by a monolithic manufacturing process.

In addition, in the light-receiving element 10 according to the first embodiment, the light absorption layer 104 is doped into p-type conductivity, as described above. Thus, an electric field is hardly generated to the light absorption layer 104. As compared with the conventional APD using an undoped Ge light absorption layer, it is possible to reduce a dark current caused by a fault occurring along with lattice mismatching with Si, thereby contributing to improvement of long-term reliability.

Second Embodiment

Figure 3:
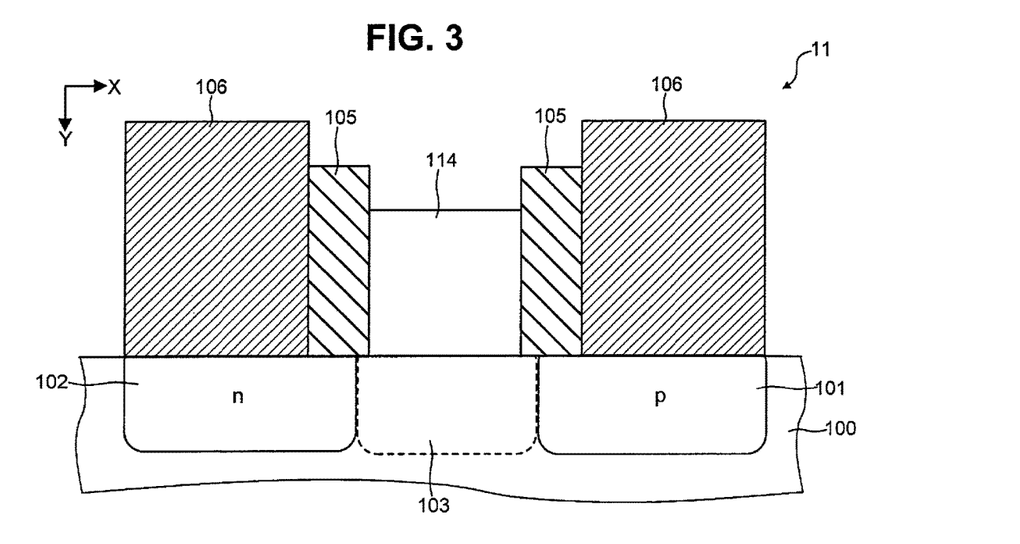
FIG. 3 is a sectional view schematically showing a light-receiving element according to the second embodiment.

FIG. 3 is a sectional view schematically showing a light-receiving element according to the second embodiment.

A light-receiving element 11 shown in FIG. 3 is different from the light-receiving element 10 according to the first embodiment in that the band gap of a light absorption layer decreases toward a multiplication region but the remaining arrangement is the same as that of the light-receiving element 10. In the following description, the same constituent elements as those of the light-receiving element 10 according to the first embodiment are denoted by the same reference numerals and a detailed description thereof will be omitted.

A light absorption layer 114 of the light-receiving element 11 is made of, for example, p-type GeSn, and is formed so that a band gap decreases toward a multiplication region 103. For example, the band gap of the light absorption layer 114 decreases in a direction (Y direction in FIG. 3) perpendicular to the plane of a semiconductor layer 100.

Figure 4:
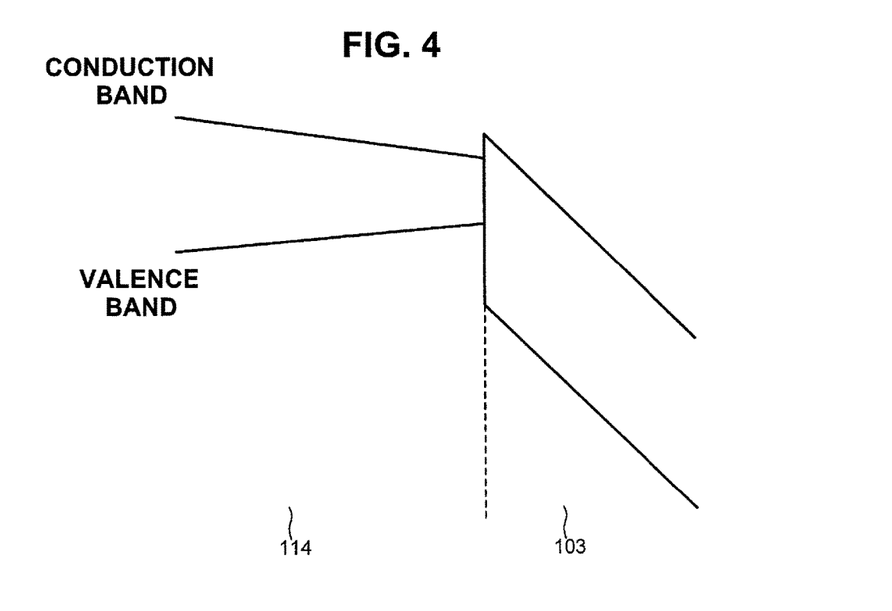
FIG. 4 is a band diagram showing a change in band gap energy in the stacking direction of the respective layers of the light-receiving element according to the second embodiment.

FIG. 4 is a band diagram showing a change in band gap energy in the stacking direction of the respective layers of the light-receiving element according to the second embodiment.

As shown in FIG. 4, the band gap of the light absorption layer 114 of the light-receiving element 11 decreases continuously or stepwise toward the interface with the semiconductor layer forming the multiplication region 103. To implement the light absorption layer 114, for example, the light absorption layer 114 is made of $Ge_xSin_{1-x}$, and a Ge composition ratio x is decreased toward the multiplication region 103 in a direction (Y direction in FIG. 3) perpendicular to the plane of the semiconductor layer 100. Furthermore, B can be exemplified as an impurity to be doped in the light absorption layer 114.

Note that as a process when manufacturing the light-receiving element 11 according to the second embodiment, a well-known Si/Ge CMOS process is applied, similarly to the light-receiving element 10 according to the first embodiment.

The light-receiving element 11 according to the second embodiment can operate as an APD at higher speed, as follows.

As described above, carrier transport in the light absorption layer 104 is limited by the diffusion rate of electrons. A band structure in which a conduction band edge shifts to the lower energy side toward the multiplication region 103 by decreasing the band gap of the light absorption layer 114 continuously (or stepwise) toward the multiplication region 103, like the light-receiving element 11 according to the second embodiment, is obtained. Thus, the electrons in the light absorption layer 114 sense an electric field in a pseudo manner and not only diffusion but also given drift effect is obtained. This can further shorten the carrier traveling time in the light absorption layer 114, and thus a higher-speed operation as an APD can be expected.

Third Embodiment

Figure 5:
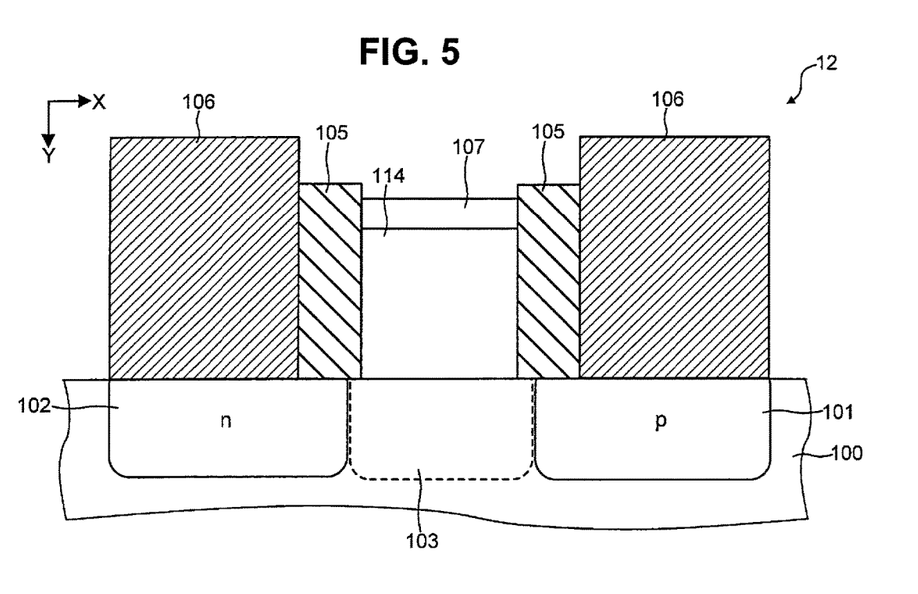
FIG. 5 is a sectional view schematically showing a light-receiving element according to the third embodiment.

FIG. 5 is a sectional view schematically showing a light-receiving element according to the third embodiment.

A light-receiving element 12 shown in FIG. 5 is different from the light-receiving element 11 according to the second embodiment in that a barrier layer is formed on a light absorption layer but the remaining arrangement is the same as that of the light-receiving element 11. In the following description, the same constituent elements as those of the light-receiving element 11 according to the second embodiment are denoted by the same reference numerals and a detailed description thereof will be omitted.

As shown in FIG. 5, the light-receiving element 12 further includes a barrier layer 107 that is formed on a light absorption layer 114 and has conduction band edge energy higher than that of the light absorption layer. More specifically, the barrier layer 107 has a conduction band edge located on the higher energy side with respect to a semiconductor layer forming the light absorption layer 114 and is formed from a semiconductor layer doped into p-type conductivity.

Figure 6:
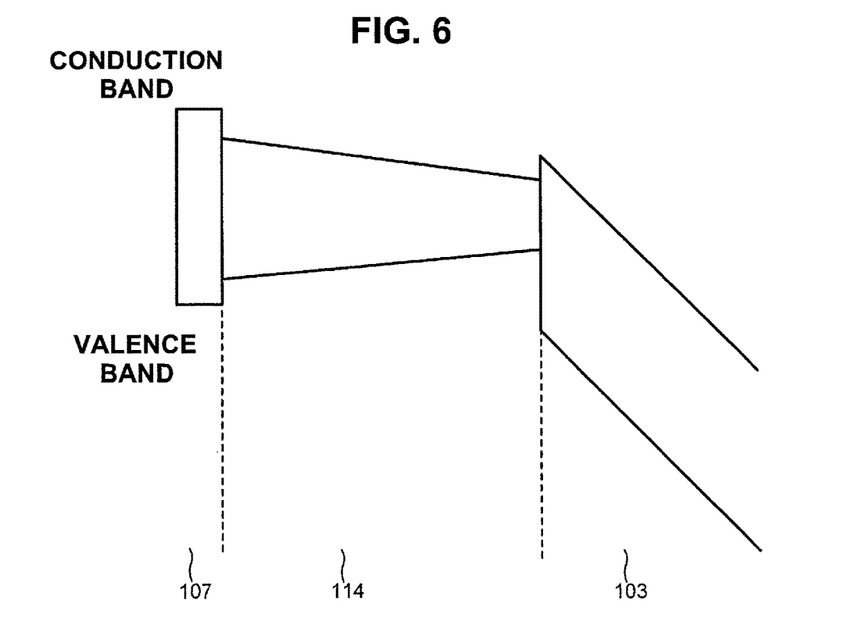
FIG. 6 is a band diagram showing a change in band gap energy in the stacking direction of the respective layers of the light-receiving element according to the third embodiment.

FIG. 6 is a band diagram showing a change in band gap energy in the stacking direction of the respective layers of the light-receiving element 12 according to the third embodiment.

As shown in FIG. 6, a semiconductor layer that has a conduction band edge located on the higher energy side with respect to the semiconductor layer forming the light absorption layer 114 and is doped into p-type conductivity is formed as the barrier layer 107 on the surface of the light absorption layer 114. Similarly to, for example, the light-receiving element 11 according to the second embodiment, the light absorption layer 114 is made of $Si_xGe_{1-x}$. The barrier layer 107 is made of, for example, Si. As an impurity to be doped in the barrier layer 107, B can be exemplified.

Note that as a process when manufacturing the light-receiving element 12 according to the third embodiment, a well-known Si/Ge CMOS process can be applied, similarly to the first and second embodiments.

The light-receiving element 12 according to the third embodiment can further improve the sensitivity as an APD, as follows.

As described above in the second embodiment, since the band gap of the light absorption layer 114 decreases continuously or stepwise toward the interface with the semiconductor layer forming the multiplication region 103, carrier transport in the light absorption layer 114 is limited by the diffusion rate and drift velocity of electrons. At this time, all the electrons generated by light injection into the light absorption layer 114 ideally move to the multiplication region 103. However, the electrons may be diffused in a direction opposite to the multiplication region 103 (a direction opposite to the direction Y in FIG. 5). Since, especially, the light absorption layer 114 is doped into p-type conductivity, band bending in which the electrons leak to the surface side of the light absorption layer 114 (in the direction opposite to the Y direction) may occur unless special passivation is performed, thereby decreasing the photoelectric conversion efficiency.

To solve this problem, by forming, as the barrier layer 107, on the surface of the light absorption layer 114, a semiconductor layer that has a conduction band edge located on the higher energy side with respect to the light absorption layer 114 and is doped into p-type conductivity, like the light-receiving element 12 according to the third embodiment, it is possible to suppress electron diffusion to the surface side of the light absorption layer 114 (in the direction opposite to the Y direction). This can improve the quantum efficiency in the light absorption layer 114, thereby improving the sensitivity as an APD.

The offset of the conduction band edge between the light absorption layer 114 and the barrier layer 107 is desirably equal to or larger than 30 meV. Assuming that the light-receiving element 12 operates at room temperature, it is possible to suppress, by thermal energy, the electrons from crossing the offset of the conduction band edge between the light absorption layer 114 and the barrier layer 107, thereby contributing to further improvement of the sensitivity.

Fourth Embodiment

Figure 7:
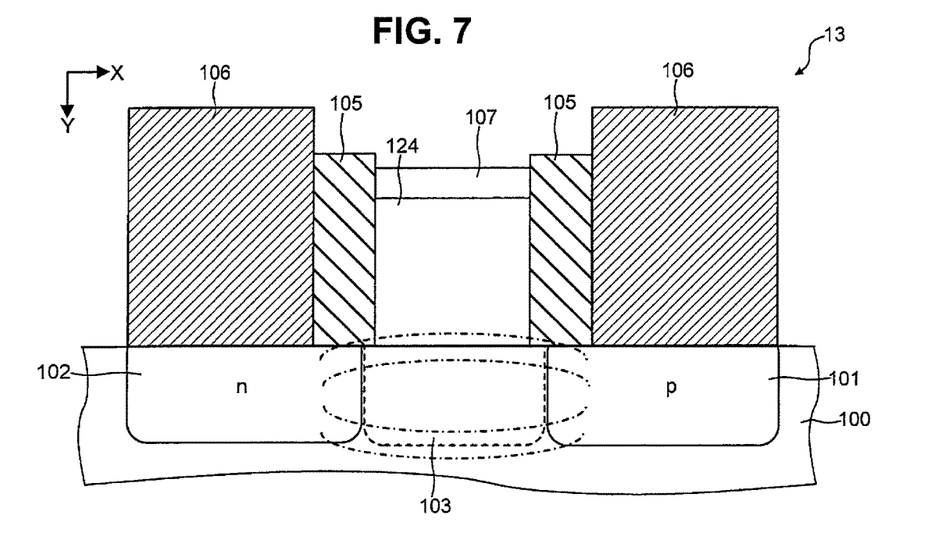
FIG. 7 is a sectional view schematically showing a light-receiving element according to the fourth embodiment.

FIG. 7 is a sectional view schematically showing a light-receiving element according to the fourth embodiment.

A light-receiving element 13 shown in FIG. 7 is different from the light-receiving element 12 according to the third embodiment in that the impurity concentration of a p-type light absorption layer decreases toward a multiplication region 103 and the semiconductor layer (substrate) of the light-receiving element is made of a III-V compound semiconductor but the remaining arrangement is the same as that of the light-receiving element 12. In the following description, the same constituent elements as those of the light-receiving element 12 according to the third embodiment are denoted by the same reference numerals and a detailed description thereof will be omitted.

In the light-receiving element 13, a semiconductor layer 100 is made of a III-V compound semiconductor. For example, the semiconductor layer 100 is an InP substrate, and the multiplication region 103 is a region of the InP substrate, where no impurity is doped. A p-type semiconductor region 101 is formed by, for example, ion implantation of zinc (Zn) as an impurity into the semiconductor layer 100 formed by the InP substrate. An n-type semiconductor region 102 is formed by, for example, ion implantation of Si as an impurity into the semiconductor layer 100 formed by the InP substrate.

When the semiconductor layer 100 is the InP substrate, the length in the X direction of the multiplication region 103 (the distance in the X direction between the p-type semiconductor region 101 and the n-type semiconductor region 102) is appropriately settable within a range of, for example, 100 nm to 200 nm.

Electrode layers 106 are made of a metal material containing, for example, titanium (Ti) or gold (Au) as a main component. A barrier layer 107 is made of, for example, InAlAs.

A light absorption layer 124 is made of a III-V compound semiconductor. The light absorption layer 124 is formed so that a band gap decreases continuously or stepwise toward the multiplication region 103 and the p-type impurity concentration decreases toward the multiplication region 103. The light absorption layer 124 will be described in detail below with reference to FIG. 8.

Figure 8:
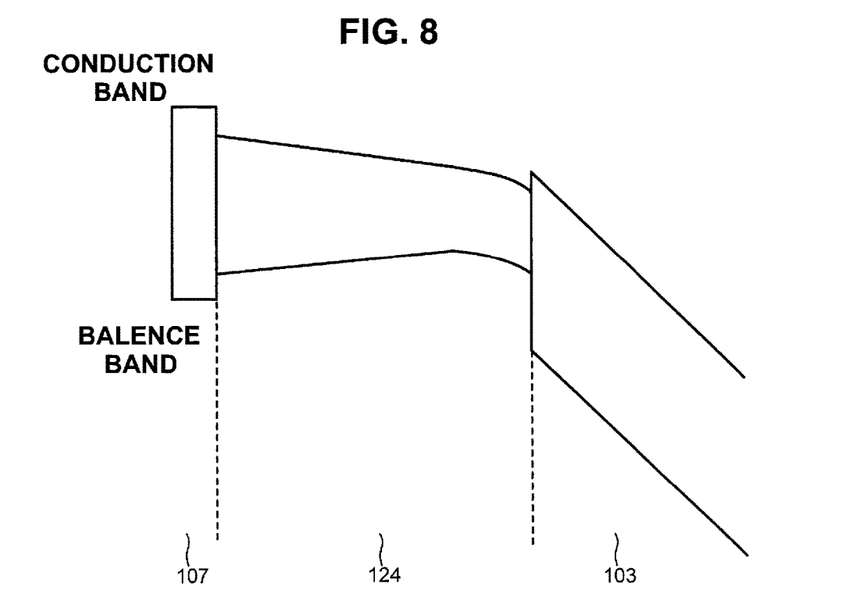
FIG. 8 is a band diagram showing a change in band gap energy in the stacking direction of the respective layers of the light-receiving element according to the fourth embodiment.

FIG. 8 is a band diagram showing a change in band gap energy in the stacking direction of the respective layers of the light-receiving element according to the fourth embodiment.

For example, the light absorption layer 124 is made of InAlGaAs, and the composition ratio of "Al" of InAlGaAs is decreased in a direction (Y direction) perpendicular to the plane of the semiconductor layer 100. This can decrease the band gap of the light absorption layer 124 continuously or stepwise toward the multiplication region 103, as shown in FIG. 8, similarly to the light-receiving element 11 according to the second embodiment and the like.

The impurity doping concentration of the light absorption layer 124 is decreased toward the multiplication region 103. More specifically, the impurity doping concentration is decreased within a range of, for example, $10^{20}$ to $10^{18}$ cm$^{-3}$ near the interface with the multiplication region 103 in the light absorption layer 124. Since this effectively causes band bending near the interface between the light absorption layer 124 and the multiplication region 103, as shown in FIG. 8, the electrons in the light absorption layer 124 are accelerated toward the multiplication region 103 and a higher-speed operation as an APD can be expected.

As an impurity to be doped in the light absorption layer 104, beryllium (Be) or zinc (Zn) can be exemplified.

Note that since part of an electric field between the p-type semiconductor region 101 and the n-type semiconductor region 102 reaches the light absorption layer 124, as shown in FIG. 7, when the impurity doping concentration of the light absorption layer 124 is made low, partial depletion may occur in the light absorption layer 124 and injection of holes into the multiplication region 103 by dielectric relaxation may be suppressed. To prevent this, the light absorption layer 124 desirably ensures an impurity doping concentration such that no partial depletion occurs in the light absorption layer 124 when operating as an APD.

Fifth Embodiment

Figure 9:
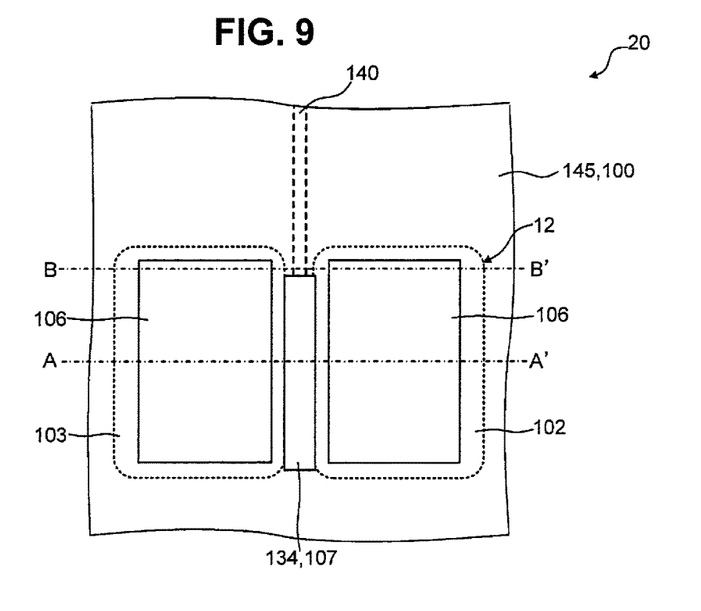
FIG. 9 is a plan view schematically showing an optical integrated circuit including a light-receiving element and an optical waveguide according to the present invention.

FIG. 9 is a plan view schematically showing an optical integrated circuit including a light-receiving element and an optical waveguide according to the present invention.

Figure 10:
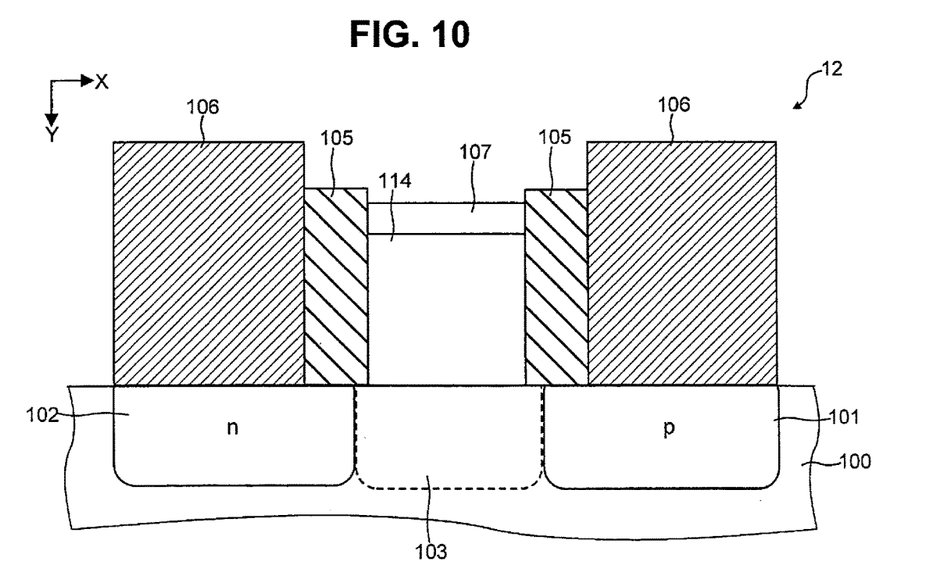
FIG. 10 is a sectional view schematically showing the optical integrated circuit taken along a line A-A' in FIG. 9.
Figure 11:
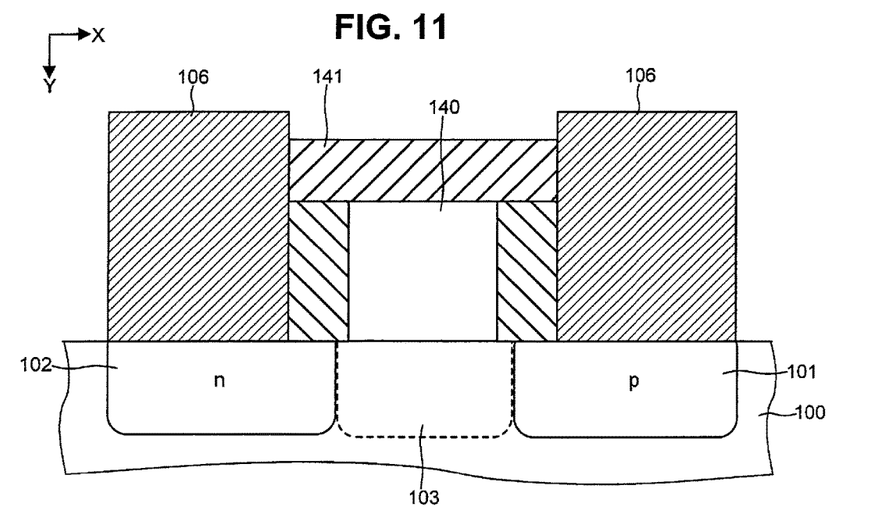
FIG. 11 is a sectional view schematically showing the optical integrated circuit taken along a line B-B' in FIG. 9.

FIG. 10 is a sectional view schematically showing the optical integrated circuit taken along a line A-A' in FIG. 9. FIG. 11 is a sectional view schematically showing the optical integrated circuit taken along a line B-B' in FIG. 9.

An optical integrated circuit 20 shown in FIGS. 9 to 11 is obtained by forming the light-receiving element and the optical waveguide according to the present invention on a semiconductor layer (substrate) 100 by monolithic manufacturing process.

More specifically, the optical integrated circuit 20 includes a light-receiving element 12, a core 140 optically coupled to a light absorption layer 114 of the light-receiving element 12, and a clad layer 141 formed on the core 140.

Note that the light-receiving element 12 according to the third embodiment is shown as an example of the light-receiving element forming the optical integrated circuit 20 shown in FIGS. 9 to 11. The present invention, however, is not limited to this. Any of the light-receiving elements 10, 11, and 13 according to the first, second, and fourth embodiments may be adopted. In the following description, the same constituent elements as those of the light-receiving element 12 according to the third embodiment are denoted by the same reference numerals and a detailed description thereof will be omitted.

As shown in FIGS. 9 and 10, the light-receiving element 12 is formed on the semiconductor layer 100. As an example, the semiconductor layer 100 having a multiplication region 103 is an Si or SOI substrate, a p-type semiconductor region 101 is formed by ion implantation of B into the semiconductor layer 100, and an n-type semiconductor region 102 is formed by ion implantation of As into the semiconductor layer 100. The light absorption layer 114 is made of p-type $Si_xGe_{1-x}$, and electrode layers 106 are made of a metal material containing W or Cu as a main component.

As shown in FIGS. 9 and 11, the core 140 is formed on the semiconductor layer 100. The core 140 is made of, for example, SiN. Furthermore, the clad layer 141 is formed on the semiconductor layer 100 to cover the core 140. The clad layer 141 is made of, for example, $SiO_2$. The core 140 and the clad layer 141 form an optical waveguide. As shown in FIG. 9, the optical waveguide formed from the core 140 and the clad layer 141 is formed to be optically coupled to the light absorption layer 114 of the light-receiving element 12.

A method of manufacturing the optical integrated circuit 20 will be briefly explained.

First, the p-type semiconductor region 101, the n-type semiconductor region 102, and the multiplication region 103 for the light-receiving element 12 are formed in the semiconductor layer 100, and then the core 140 constituting the optical waveguide is formed on the semiconductor layer 100. For example, the core 140 is formed by depositing an SiN layer on the semiconductor layer 100, and then patterning the SiN layer.

Next, the clad layer 141 is formed on the core 140. For example, a silicon oxide layer (for example, $SiO_2$) is formed on the semiconductor layer 100 to cover the semiconductor layer 100 and the clad layer 141. For example, the silicon oxide layer is formed by a plasma CVD method. Next, an opening is formed in a region of an upper portion of the multiplication region 103 in the silicon oxide layer. For example, the region of the upper portion of the multiplication region 103 in the silicon oxide layer is selectively removed by a well-known photolithography technique and dry etching technique.

Next, the light absorption layer 114 is formed by selectively growing, for example, $Si_xGe_{1-x}$ on the multiplication region 103 in the semiconductor layer 100 using, as a selective growth mask, the silicon oxide layer in which the opening has been formed. For example, similarly to the manufacturing process of the light-receiving element according to the first embodiment, $Si_xGe_{1-x}$ is selectively grown on the multiplication region 103 in the semiconductor layer 100 by a well-known CVD method or the like.

Next, the electrode layers 106 are formed. The silicon oxide layer (clad layer 141) deposited on the p-type semiconductor region 101 and the n-type semiconductor region 102 in the semiconductor layer 100 is selectively removed by, for example, a well-known photolithography technique and dry etching technique. Then, the electrode layers 106 made of a metal material containing, for example, W or Cu are formed on the p-type semiconductor region 101 and the n-type semiconductor region 102 by, for example, a well-known lift-off method. More specifically, after a resist pattern used to selectively remove the silicon oxide layer is left and the metal material containing W or Cu is deposited on the semiconductor layer 100 and resist pattern, the resist pattern is removed. This forms the electrode layers 106 on the p-type semiconductor region 101 and the n-type semiconductor region 102. To deposit W, for example, a well-known evaporation method is used. To deposit Cu, for example, a well-known plating method is used.

By performing the above steps, the optical integrated circuit 20 can be manufactured.

In the optical integrated circuit 20 according to this embodiment, it is possible to implement high-quality optical coupling between the optical waveguide and the light absorption layer of the light-receiving element without departing from a normal CMOS process. For example, in many conventional waveguide type APDs, the light absorption layer of the APD and an optical waveguide are optically coupled by evanescent coupling. Therefore, the optical coupling efficiency is insufficient and the light-receiving sensitivity of the APD is low. To the contrary, in the optical integrated circuit 20 according to this embodiment, it is possible to optically couple the optical waveguide and the light absorption layer by a butt joint since the optical waveguide is formed as part of a step of forming the light-receiving element as an APD (for example, a step of forming insulating layers). This can improve the optical coupling efficiency between the optical waveguide and the light absorption layer of the light-receiving element in the optical integrated circuit 20, and improve the light-receiving sensitivity of the light-receiving element as an APD.

Sixth Embodiment

Figure 12:
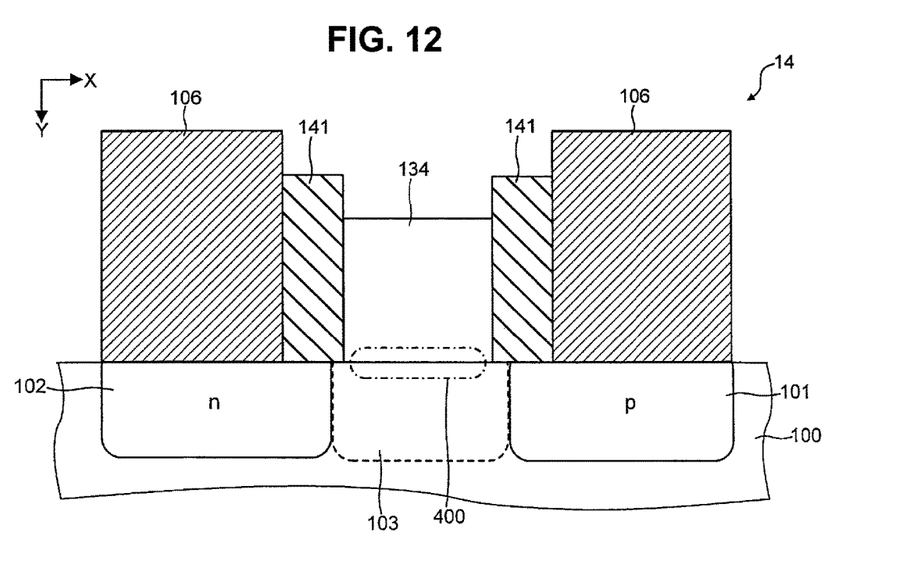
FIG. 12 is a sectional view schematically showing a light-receiving element according to the sixth embodiment.

FIG. 12 is a sectional view schematically showing a light-receiving element according to the sixth embodiment.

A light-receiving element 14 shown in FIG. 12 is different from the light-receiving element 10 according to the first embodiment in that a light absorption layer is made of a p-type III-V compound semiconductor but the remaining arrangement is the same as that of the light-receiving element 10. In the following description, the same constituent elements as those of the light-receiving element 10 according to the first embodiment are denoted by the same reference numerals and a detailed description thereof will be omitted.

In the light-receiving element 14, a semiconductor layer 100 is an Si or SOI substrate, and a multiplication region 103 is a region of the surface Si layer of the Si or SOI substrate, where no impurity is doped. A p-type semiconductor region 101 is formed by, for example, ion implantation of B as an impurity into the surface Si layer of the semiconductor layer 100 formed by the Si or SOI substrate. An n-type semiconductor region 102 is formed by, for example, ion implantation of As as an impurity into the surface Si layer of the semiconductor layer 100 formed by the Si or SOI substrate.

A light absorption layer 134 is made of, for example, a III-V compound semiconductor. The light absorption layer 134 is formed on the Si or SOI substrate by a so-called "III-V on Si technique" of bonding the III_V compound semiconductor on the Si or SOI substrate at a wafer level or chip level. More specifically, for example, p-type InGaAs is epitaxially grown on a crystal substrate of InP or the like, and InGaAs and the semiconductor layer 100 (Si or SOI substrate) undergo wafer bonding to a bonding surface 400 of the multiplication region 103. As wafer bonding, a well-known surface activation method is used.

Wafer bonding is performed at the initial stage of the manufacturing process of the light-receiving element. For example, after forming the p-type semiconductor region 101 and the n-type semiconductor region 102 in the Si or SOI substrate as the semiconductor layer 100, InGaAs having undergone crystal growth is bonded to the semiconductor layer 100. After bonding, similarly to the light-receiving element 10 according to the first embodiment, respective layers forming the light-receiving element are formed by a well-known photolithography technique, dry etching, and the like which are used in the normal CMOS process. This does not impair the ease of the manufacturing process even in the light-receiving element according to the sixth embodiment.

As described above, the light-receiving element according to the sixth embodiment can implement a higher-speed and higher-sensitive APD. For example, when Si is used for the multiplication region of the APD, the light-receiving element is advantageous in terms of high-density integration and high gain bandwidth product (GBP). In this case, Ge, GeSn, or the like that has a lattice constant relatively close to that of Si forming the multiplication region is generally used for the light absorption layer. However, the APD using Ge or GeSn for the light absorption layer is disadvantageous in terms of the electron mobility and optical absorption coefficient, as compared with the APD using a III-V compound semiconductor (InGaAs).

To the contrary, since the light-receiving element according to the sixth embodiment uses Si as the multiplication region 103 of the light-receiving element 14 and uses a III-V compound semiconductor (for example, InGaAs) as the light absorption layer 134 by wafer bonding of dissimilar materials, it is possible to further increase the speed and improve the sensitivity as an APD.

The invention made by the present inventors has been described in detail above based on the embodiments. However, the present invention is not limited to them, and various changes can be made without departing from the spirit of the invention.

For example, a case has been exemplified in which the barrier layer 107 is formed on the surface of the light absorption layer 114 formed so that the band gap decreases toward the multiplication region 103 in the light-receiving element 12 according to the third embodiment. However, even in the light-receiving element according to each of other embodiments, a barrier layer can be formed on the surface of the light absorption layer in the same manner.

The second embodiment has exemplified a case in which the light absorption layer 114 is made of p-type $Ge_xSn_{1-x}$, and the Ge composition ratio x is decreased toward the multiplication region 103 in the direction perpendicular to the plane of the semiconductor layer 100. The present invention, however, is not limited to this. For example, the light absorption layer 114 may be made of p-type $Ge_xSn_{1-x}$, and the Ge composition ratio x may be increased toward the multiplication region 103 in the direction perpendicular to the plane of the semiconductor layer 100. This can further shorten the carrier traveling time in the light absorption layer, and thus a higher-speed operation as an APD can be expected, similarly to the light-receiving element 12 according to the second embodiment.

In the above embodiments, Si/SiGe, InP/InAlGaAs, and Si/InGaAs have been exemplified as combinations of materials of the multiplication region and light absorption layer as an APD. The present invention, however, is not limited to them and other materials may be combined.

The fifth embodiment has exemplified SiN and $SiO_2$ as a combination of the core 140 and the clad layer 141 forming the optical waveguide. The present invention, however, is not limited to this, and other materials may be combined to form an optical waveguide.

In the above embodiments, a reflection film or antireflection film may be formed in each of the end portions of the light absorption layers 104 to 124 of the light-receiving elements 10 to 13. In the optical integrated circuit 20, a reflection film or antireflection film may be formed in a bonding portion between the light absorption layer 134 and the optical waveguide (the core 140 and the clad layer 141) or an incident portion on the optical waveguide. An intermediate layer may be formed appropriately between the electrode layers 106 and the p-type semiconductor region 101 and n-type semiconductor region 102 or between the multiplication region 103 and each of the light absorption layer 104 to 124 in terms of a reduction in ohmic resistance, band alignment, or the like. Note that these additional elements can be implemented by applying a well-known semiconductor manufacturing process.

Each of the first to fifth embodiments has exemplified a method of forming a light absorption layer by selectively growing it on the multiplication region 103. The present invention, however, is not limited to this as long as it is possible to form a light absorption layer on the multiplication region 103. For example, a light absorption layer may be formed on the multiplication region 103 by wafer bonding, chip bonding, or the like.

INDUSTRIAL APPLICABILITY

A light-receiving element and an optical integrated circuit according to the present invention can be widely used for, for example, an optical receiver in optical communication and the like.

EXPLANATION OF THE REFERENCE NUMERALS AND SIGNS

11, 12, 13 . . . light-receiving element, 20 . . . optical integrated circuit, 100 . . . semiconductor layer, 101 . . . p-type semiconductor region, 102 . . . n-type semiconductor region, 103 . . . multiplication region, 104, 114, 124, 134 . . . light absorption layer, 105 . . . insulating layer, 106 . . . electrode layer, 107 . . . barrier layer, 140 . . . core, 141 . . . clad layer, 400 . . . bonding surface

The invention claimed is:
1. A light-receiving element comprising:
a semiconductor layer including a p-type semiconductor region, an n-type semiconductor region, and a multiplication region, the p-type semiconductor region, the n-type semiconductor region, and the multiplication region being arranged along a planar direction of the semiconductor layer; and
a p-type light absorption layer being in contact with the multiplication region and formed in a direction perpendicular to the planar direction with respect to the multiplication region,
wherein the p-type semiconductor region and the n-type semiconductor region are formed to sandwich the multiplication region, and the light absorption layer has a band gap that decreases toward the multiplication region.

2. The light-receiving element according to claim 1, further comprising:
a barrier layer that is formed on the light absorption layer and has a conduction band edge energy higher than that of the light absorption layer.

3. The light-receiving element according to claim 1, wherein the light absorption layer has a p-type impurity concentration that decreases toward the multiplication region.

4. The light-receiving element according to claim 1, wherein
the multiplication region includes Si,
the light absorption layer includes $Ge_xSi_{1-x}$, and
the light absorption layer has a composition ratio x of $Ge_xSi_{1-x}$ that increases toward the multiplication region.

5. The light-receiving element according to claim 1, wherein
the multiplication region includes Si,
the light absorption layer includes $Ge_xSi_{1-x}$, and
the light absorption layer has a composition ratio x of $Ge_xSi_{1-x}$ that decreases toward the multiplication region.

6. The light-receiving element according to claim 3, wherein
the multiplication region includes a compound semiconductor,
the light absorption layer includes a compound semiconductor, and
a composition ratio of the compound semiconductor forming the light absorption layer decreases toward the multiplication region.

7. The light-receiving element according to claim 1, wherein
the multiplication region includes Si, and
the light absorption layer includes a compound semiconductor.

8. An optical integrated circuit comprising:
the light-receiving element defined in claim 1;
a core that is formed on the semiconductor layer and optically coupled to a light absorption layer; and
a clad layer formed on the core.

* * * * *